US009499913B2

(12) United States Patent
Norkus et al.

(10) Patent No.: US 9,499,913 B2
(45) Date of Patent: Nov. 22, 2016

(54) ELECTROLESS DEPOSITION OF CONTINUOUS PLATINUM LAYER USING COMPLEXED $CO^{2+}$ METAL ION REDUCING AGENT

(71) Applicant: Lam Research Corporation, Fremont, CA (US)

(72) Inventors: Eugenijus Norkus, Vilnius (LT); Ina Stankeviciene, Vilnius (LT); Aldona Jagminiene, Vilnius (LT); Loreta Tamasauskaite-Tamasiunaite, Vilnius (LT); Aniruddha Joi, Fremont, CA (US); Yezdi Dordi, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 238 days.

(21) Appl. No.: 14/243,793

(22) Filed: Apr. 2, 2014

(65) Prior Publication Data
US 2015/0284857 A1 Oct. 8, 2015

(51) Int. Cl.
*C23C 18/44* (2006.01)
*C23C 18/16* (2006.01)
*H01L 21/288* (2006.01)
*H01L 21/768* (2006.01)

(52) U.S. Cl.
CPC ............ *C23C 18/44* (2013.01); *C23C 18/166* (2013.01); *C23C 18/168* (2013.01); *C23C 18/1683* (2013.01); *H01L 21/288* (2013.01); *H01L 21/76849* (2013.01)

(58) Field of Classification Search
CPC . C23C 18/44; C23C 18/1617; C23C 18/166; C23C 18/168; C23C 18/1683
USPC .............................. 106/1.24, 1.28; 427/443.1
See application file for complete search history.

(56) References Cited

U.S. PATENT DOCUMENTS

| | | | | |
|---|---|---|---|---|
| 3,698,939 A * | 10/1972 | Leaman | ................... | C23C 18/44 106/1.28 |
| 4,279,951 A * | 7/1981 | Hough | .................... | C23C 18/44 106/1.24 |
| 5,160,373 A | 11/1992 | Senda et al. | | |
| 5,364,459 A | 11/1994 | Senda et al. | | |
| 6,338,787 B1 | 1/2002 | Obata et al. | | |
| 8,298,325 B2 * | 10/2012 | Norkus | ................... | C23C 18/40 106/1.23 |
| 2002/0152955 A1* | 10/2002 | Dordi | .................. | C23C 18/1632 118/63 |
| 2004/0037770 A1* | 2/2004 | Fischer | .................... | B01J 23/42 423/584 |
| 2012/0104331 A1* | 5/2012 | Kolics | ....................... | H01B 1/02 106/1.28 |
| 2015/0232995 A1* | 8/2015 | Norkus | ................... | C23C 18/44 427/443.1 |
| 2015/0307995 A1* | 10/2015 | Norkus | ................ | H01L 21/288 438/678 |

* cited by examiner

Primary Examiner — Helene Klemanski
(74) Attorney, Agent, or Firm — Beyer Law Group LLP

(57) ABSTRACT

A solution for electroless deposition of platinum is provided. The solution comprises $Co^{2+}$ ions, $Pt^{4+}$ ions, and amine ligands. A ratio of $Co^{2+}$ to $Pt^{4+}$ ion is between 100:1 and 2:1. The solution allows for electroless deposition of platinum without requiring high temperatures and high pH. The solution allows for the deposition of a pure platinum layer.

20 Claims, 2 Drawing Sheets

ELECTROLESS DEPOSITION OF CONTINUOUS PLATINUM LAYER USING COMPLEXED CO²⁺ METAL ION REDUCING AGENT

BACKGROUND OF THE INVENTION

Field of the Invention

The invention relates to a method of forming semiconductor devices on a semiconductor wafer. More specifically, the invention relates to depositing platinum containing layers to form semiconductor devices.

In forming semiconductor devices, thin layers of platinum may be deposited. Such a deposition may be provided by electroless plating.

SUMMARY OF THE INVENTION

To achieve the foregoing and in accordance with the purpose of the present invention, a method for providing an electroless plating of a platinum containing layer is provided. A stable $Co^{2+}$ concentrated stock solution is provided. A stable $Pt^{4+}$ concentrated stock solution is provided. A flow from the $Co^{2+}$ concentrated stock solution is combined with a flow from the $Pt^{4+}$ concentrated stock solution and oxygen free degassed DI water to provide a mixed electrolyte solution for electrolessly depositing Pt. A substrate is exposed to the mixed electrolyte solution.

In another manifestation of the invention, a solution for electroless deposition of platinum is provided. The solution comprises $Co^{2+}$ ions, $Pe^+$ ions, and amine ligands.

In another manifestation of the invention, a method for providing an electroless plating of a platinum layer is provided. A solution for electroless deposition of platinum is provided. The solution comprises $Co^{2+}$ ions, $Pe^+$ ions, and amine ligands. A substrate is exposed to the solution for electroless deposition of platinum.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
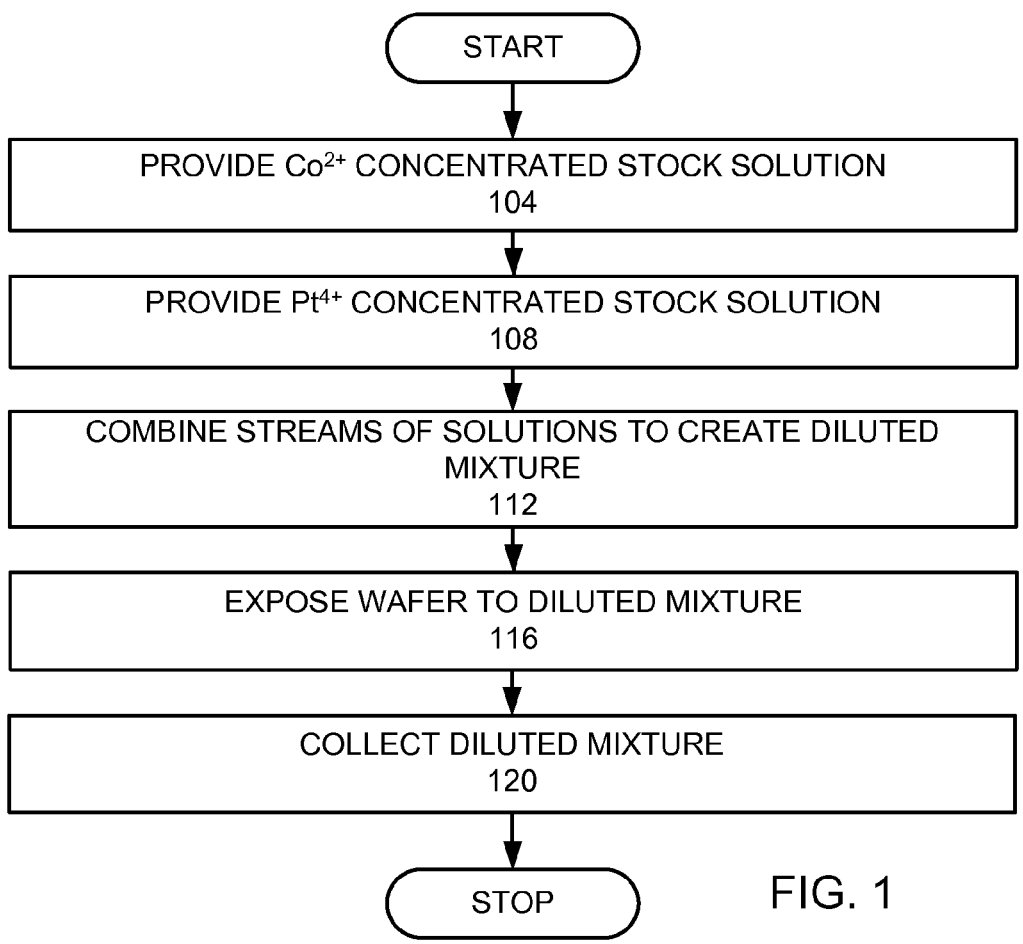
FIG. 1 is a flow chart of an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Electroless deposition of platinum has been accomplished using hydrazine and other hydrogen containing compounds as reducing agents. In addition to the environmental concerns associated with these hydrogen containing reducing agents, the oxidation reaction of these species involves the generation of $N_2$ gas, which can be incorporated in the deposit. This impacts the purity of the deposited film, as well as quality of the coatings. Additionally, the hydrazine-platinum electrolyte requires operation at an elevated temperature and high pH for practical applications. Such requirements are undesirable for back end metallization of semiconductor interconnects, as the dielectric materials are prone to damage at high pH or temperature.

An embodiment of the invention provides an electroless plating bath containing $Co^{2+}$ for depositing Pt, where the $Pt^{4+}$ is reduced from solution to form a platinum metal layer, while $Co^{2+}$ is oxidized to a higher more stable oxidation state of $Co^{3+}$. $Co^{2+}$ has significant benefits over hydrazine and other hydrogen containing reducing agents. Replacing hydrazine with a $Co^{2+}$ metal ion reducing agent eliminates the toxicity and volatility that is inherent to hydrazine and makes the plating bath more environmentally friendly. Additionally, no gas evolution (i.e. $N_2$) or side reaction is observed at the electrode. This results in a smooth, continuous, pure Pt film. The $Co^{2+}$ metal ion containing plating bath can also be operated over a wide temperature and pH range. The ability to deposit pure platinum film selectively at room temperature and relatively low pH makes its application in back end interconnect metallization particularly attractive, since conventional electrolytes operate at high pH and temperature which causes pattern collapse.

The $Co^{2+}$ metal ion reducing agent containing bath, used in an embodiment of the invention, is operable below room temperature and with a low pH. This is not possible with the hydrazine and other reducing agent containing electrolyte. The extended window of operation makes this bath attractive for application as a copper capping layer in interconnects metallization where neutral to low pH and low temperature are desired to prevent pattern collapse.

Formation of Pt electrodes for memory applications using plasma etching is difficult. An embodiment of the invention enables selective patterning of Pt electrodes in semiconductor manufacturing without using plasma etching. The cost and complexity associated with maintaining a high temperature during plating can also be reduced due to near room temperature operation of the $Co^{2+}$ metal ion reducing agent electrolyte.

FIG. 1 is a high level flow chart of an embodiment of the invention. In this embodiment, a $Co^{2+}$ concentrated stock solution is provided (step 104). A $Pt^{4+}$ concentrated stock solution is provided (step 108). A flow from the $Co^{2+}$ concentrated stock solution is combined with a flow from the $Pt^{4+}$ concentrated stock solution and water to provide a mixed electrolyte solution of the $Co^{2+}$ concentrated stock solution and the $Pt^{4+}$ concentrated stock solution (step 112). A wafer is exposed to the mixed electrolyte solution of the $Co^{2+}$ concentrated stock solution and the $Pt^{4+}$ concentrated stock solution (step 116). The mixed electrolyte solution is collected and may be reactivated for future use or disposed (step 120).

Figure 2:
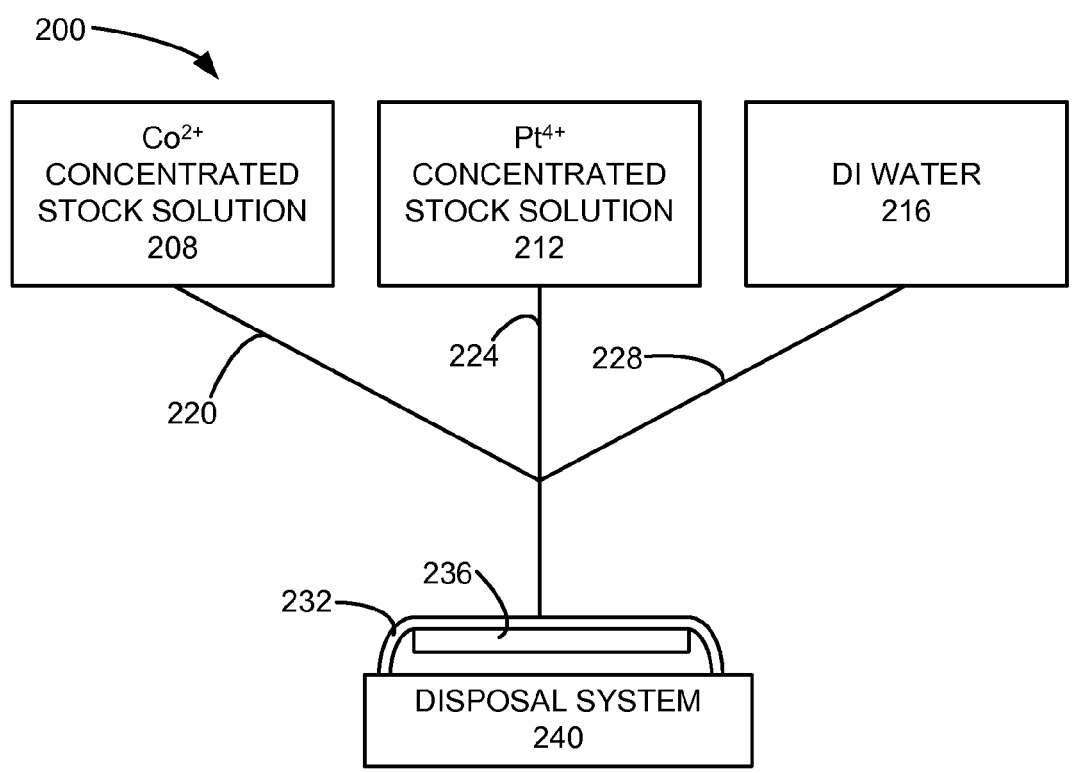
FIG. 2 is a schematic view of a system that may be used in an embodiment of the invention.

In an example, a $Co^{2+}$ concentrated stock solution is provided in a $Co^{2+}$ concentrated stock solution source (step 104). A $Pt^{4+}$ concentrated stock solution is provided in a $Pt^{4+}$ concentrated stock solution source (step 108). FIG. 2 is a schematic view of a system 200 that may be used in an embodiment of the invention. The system comprises a $Co^{2+}$ concentrated stock solution source 208 containing a $Co^{2+}$ concentrated stock solution, a $Pt^{4+}$ concentrated stock solution source 212 containing a $Pt^{4+}$ concentrated stock solution, and a deionized water (DI) source 216 containing DI. A flow 220 from the $Co^{2+}$ concentrated stock solution source 208 is combined with a flow 224 from the $Pt^{4+}$ concentrated stock solution source 212 and a flow 228 from the DI water source 216 to provide a mixed electrolyte solution 232 of the $Co^{2+}$ concentrated stock solution and the $Pt^{4+}$ concentrated stock solution (step 112). A wafer 236 is exposed to the mixed electrolyte solution 232 of the $Co^{2+}$ concentrated stock solution and the $Pt^{4+}$ concentrated stock solution (step 116). The mixed electrolyte solution 232 is collected (step 120). A disposal system 240 may be used to dispose the mixed electrolyte solution 232. An alternative embodiment provides the collection of the mixed electrolyte solution 232, which could be reactivated.

In this example, the $Co^{2+}$ concentrated stock solution comprises a $CoSO_4$ containing solution. The $Pt^{4+}$ concentrated stock solution comprises $H_2PtCl_6$ and ammonium hydroxide.

In one embodiment, the flow 220 of the $Co^{2+}$ concentrated stock solution is combined with the flow 224 of the $Pt^{4+}$ concentrated stock solution and the flow 228 of DI water, to form a mixed electrolyte solution of 0.6 M HCl, 0.6 M $NH_4OH$, 0.004 M $H_2PtCl_6$, 0.2 M $CoCl_2$, and 0.12 M Diethylenetriamine. The mixed electrolyte solution has a pH of between 7-7.4 and a temperature of about 20° C.

The $Co^{2+}$ concentrated stock solution provides a stable $Co^{2+}$ solution that has a shelf life of several years without degrading. The high concentration allows the $Co^{2+}$ concentrated stock solution to be stored in a smaller volume. In addition, the $Pt^{4+}$ concentrated stock solution provides a stable $Pt^{4+}$ solution that has a shelf life of several years without degrading. The high concentration allows the $Pt^{4+}$ concentrated stock solution to be stored in a smaller volume. The solutions are combined and diluted just prior to exposing the wafer to the mixed electrolyte solution, since the mixed electrolyte solution does not have as long a shelf life as the concentrated stock solutions.

The mixed electrolyte solution is able to deposition on Cu substrates without any activation. Deposition on non conductive or poorly conductive substrates such as glass and 1-2 nm Ru may be accomplished using proper activation protocols.

This embodiment of the invention provides a platinum containing layer with a thickness of between 1 nm and 30 nm. Preferably, the platinum containing layer is pure platinum. Because the platinum containing layer is relatively thin, a dilute bath is sufficient. In one embodiment, the wafer is exposed to a continuous flow of the mixed electrolyte solution. In another embodiment, the wafer is placed in a still bath of the mixed electrolyte solution for a period of time. Since the concentration of platinum and cobalt is very low in the mixed electrolyte solution, in one embodiment, the mixed electrolyte solution may be disposed (step 120) after being exposed to the wafer, since the low concentration means that only a small amount of platinum and cobalt is discarded. In another embodiment, the mixed electrolyte solution is recycled after being exposed to the wafer. The recycling may be accomplished through reactivation of the dilute mixture.

In another embodiment the mixed electrolyte solution comprises 0.002 M $H_2PtCl_6$, 0.04 M $CoSO_4$, and 0.13 M Ethylenediamine. The pH is maintained at about 10. The temperature is maintained at about 20° C.

Generally the mixed electrolyte solution used for plating has $Co^{2+}$ and $Pt^{4+}$ ions at a $Co^{2+}$ to $Pt^{4+}$ ion ratio between 100:1 and 2:1. More preferably, the mixed electrolyte solution used for plating has $Co^{2+}$ and $Pt^{4+}$ ions at a $Co^{2+}$ to $Pt^{4+}$ ion ratio between 50:1 and 4:1. Preferably, the mixed electrolyte solution has a ratio of amine ligands to $Co^{2+}$ is between 12:1 and 2:1. In addition, the $Pt^{4+}$ ions come from $H_2PtCl_6$. The $Co^{2+}$ ions come from $CoSO_4$. The amine ligands come from $NH_4OH$ or Ethylenediamine. It was unexpectedly found that amine ligands allow a $Co^{2+}$ reducing agent to successfully allow the deposition of platinum from $Pt^{4+}$. Without being limited by theory, it is believed that amine ligands help to provide a lower temperature and lower pH platinum deposition. In an embodiment, the $Co^{2+}$ concentrated stock solution further comprises amine ligands.

Generally, a wafer or other plating surface is exposed to the solution mixture at a temperature between 10° to 40° C. A plating surface is a surface on which the platinum containing layer is selectively deposited. Such selective deposition may use a mask to protect surfaces where deposition is not desired. Preferably, the solution mixture has a pH from 6 to 11. Preferably, the solution mixture provides $Co^{2+}$ with a concentration between 1-500 mM. More preferably, the solution mixture provides $Co^{2+}$ with a concentration between 25-300 mM. Most preferably, the solution mixture provides $Co^{2+}$ with a concentration between 30-250 mM. The lower temperature and lower pH provide a deposition with less damage to layers provided by the semiconductor fabrication process. In addition, such a process does not require any activation step that might attack and damage the copper substrate. In addition, such a process does not create a gas byproduct.

Preferably, the solution mixture is boron free. Preferably, the solution mixture is phosphorus free. Preferably, the solution mixture is hydrazine free. Preferably, the solution mixture is formaldehyde free. It has been found that providing a solution mixture that is boron, phosphorus, hydrazine, and formaldehyde free allows for a more pure plating that does not have impurities provided by using boron-containing reducing agents, phosphorus-containing reducing agents, hydrazine, or formaldehyde. In addition, avoiding using hydrazine provides a safer and more environmentally friendlier process.

In other embodiments, the source of $Co^{2+}$ is $CoCl_2$ or $Co(CH_3COO)_2$ or other soluble salts of $Co^{2+}$. In one embodiment, the deposited platinum containing layer is at least 99.9% pure platinum. More preferably, the deposited platinum containing layer is pure platinum.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A solution for electroless deposition of platinum, comprising:
   $Co^{2+}$ ions;
   $Pt^{4+}$ ions; and
   amine ligands.

2. The solution, as recited in claim 1, wherein the solution has a pH between 6 and 11, inclusive and a ratio of $Co^{2+}$ to $Pt^{4+}$ ion is between 100:1 and 2:1.

3. The solution, as recited in claim 2, further comprising $Cl^-$ ions.

4. The solution, as recited in claim 3, wherein the concentration of $Co^{2+}$ ions is 1-500 mM.

5. The solution, as recited in claim 1, wherein the solution is boron, phosphorus, hydrazine, and formaldehyde free.

6. A method for providing an electroless plating of a platinum containing layer, comprising:
providing a $Co^{2+}$ concentrated stock solution;
providing a $Pt^{4+}$ concentrated stock solution;
combining a flow from the $Co^{2+}$ concentrated stock solution with a flow from the $Pt^{4+}$ concentrated stock solution and water to provide a mixed electrolyte solution of the $Co^{2+}$ concentrated stock solution and the $Pt^{4+}$ concentrated stock solution; and
exposing a substrate to the mixed electrolyte solution of the $Co^{2+}$ concentrated stock solution and the $Pt^{4+}$ concentrated stock solution.

7. The method, as recited in claim 6, wherein exposing the substrate to the mixed electrolyte solution of the $Co^{2+}$ concentrated stock solution and the $Pt^{4+}$ concentrated stock solution, comprises:
providing a solution temperature between 10° to 40° C., inclusive; and
providing a pH of between 6 and 11, inclusive.

8. The method, as recited in claim 7, wherein exposing the substrate to the mixed electrolyte solution of the $Co^{2+}$ concentrated stock solution and the $Pt^{4+}$ concentrated stock solution provides $Co^{2+}$ with a concentration between 1-500 mM.

9. The method, as recited in claim 8, further comprising disposing the mixed electrolyte solution.

10. The method, as recited in claim 9, wherein the platinum containing layer is 99.9% pure platinum.

11. The method, as recited in claim 8, further comprising reactivating the mixed electrolyte solution.

12. The method, as recited in claim 8, wherein the $Co^{2+}$ concentrated stock solution comprises a solution of $CoSO_4$.

13. The method, as recited in claim 12, wherein the $Pt^{4+}$ concentrated stock solution comprises a solution of $H_2PtCl_6$ and amine ligands.

14. The method, as recited in claim 13, wherein the $Co^{2+}$ concentrated stock solution further comprises amine ligands.

15. The method, as recited in claim 14, wherein the $Pt^{4+}$ concentrated stock solution has a shelf life of over a year.

16. The method, as recited in claim 15, wherein the $Co2+$ concentrated stock solution has a shelf life of over a year.

17. The method, as recited in claim 14, wherein the mixed electrolyte solution is boron, phosphorus, hydrazine, and formaldehyde free.

18. The method, as recited in claim 6, wherein the mixed electrolyte solution is boron, phosphorus, hydrazine, and formaldehyde free.

19. A method for providing an electroless plating of a platinum layer, comprising:
providing a solution for electroless deposition of platinum, comprising:
$Co^{2+}$ ions;
$Pt^{4+}$ ions; and
amine ligands; and
exposing a substrate to the solution for electroless deposition of platinum.

20. The method, as recited in claim 19, wherein the providing the solution, provides the solution at a pH of between 6 and 11, inclusive, and at a temperature between 10° to 40° C., inclusive and, wherein a ratio of $Co^{2+}$ to $Pt^{4+}$ ion is between 100:1 to 2:1.

* * * * *